United States Patent
Aoki et al.

(10) Patent No.: US 7,646,140 B2
(45) Date of Patent: Jan. 12, 2010

(54) PIEZOELECTRIC ELEMENT CONTAINING PEROVSKITE TYPE OXIDE, AND LIQUID JET HEAD AND ULTRASONIC MOTOR USING THE PIEZOELECTRIC ELEMENT

(75) Inventors: Katsumi Aoki, Yokohama (JP); Kenichi Takeda, Yokohama (JP); Tetsuro Fukui, Yokohama (JP); Hiroshi Funakubo, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/364,429

(22) Filed: Feb. 2, 2009

(65) Prior Publication Data
US 2009/0140197 A1 Jun. 4, 2009

Related U.S. Application Data

(62) Division of application No. 11/852,878, filed on Sep. 10, 2007, now Pat. No. 7,525,239.

(30) Foreign Application Priority Data
Sep. 15, 2006 (JP) .............................. 2006-250601

(51) Int. Cl.
H01L 41/187 (2006.01)
(52) U.S. Cl. .................................... 310/358
(58) Field of Classification Search ................ 310/358; 252/62.9 R, 62.9 PZ; 501/134
See application file for complete search history.

(56) References Cited

U.S. PATENT DOCUMENTS

| 5,663,032 A | 9/1997 | Fukui et al. |
|---|---|---|
| 6,783,588 B2 | 8/2004 | Aoto et al. |
| 7,042,141 B2 | 5/2006 | Funakubo et al. |
| 7,216,962 B2 | 5/2007 | Miyazawa et al. |
| 7,262,545 B2 | 8/2007 | Takeuchi et al. |
| 7,567,022 B2 * | 7/2009 | Fukui et al. ................. 310/358 |
| 2004/0231581 A1 | 11/2004 | Aoto et al. |
| 2005/0001514 A1 * | 1/2005 | Takeuchi et al. ............ 310/328 |
| 2007/0060467 A1 | 3/2007 | Matsuda et al. |

(Continued)

FOREIGN PATENT DOCUMENTS

JP  6-350154  12/1994

(Continued)

OTHER PUBLICATIONS

J. Wang, et al., "Epitaxial BiFeO3 Multiferroic Thin Film Heterostructures", Science, vol. 299, 2003, pp. 1719-1722.

(Continued)

*Primary Examiner*—J. SanMartin
(74) *Attorney, Agent, or Firm*—Fitzpatrick, Cella, Harper & Scinto

(57) ABSTRACT

There is disclosed a piezoelectric element having, on a substrate, a piezoelectric body and a pair of electrodes which come in contact with the piezoelectric body, wherein the piezoelectric body consists of a perovskite type oxide represented by the following formula (1):

$$(Bi,Ba)(M,Ti)O_3 \tag{1}$$

in which M is an atom of one element selected from the group consisting of Mn, Cr, Cu, Sc, In, Ga, Yb, Al, Mg, Zn, Co, Zr, Sn, Nb, Ta and W, or a combination of the atoms of the plurality of elements.

4 Claims, 5 Drawing Sheets

U.S. PATENT DOCUMENTS

| | | |
|---|---|---|
| 2007/0190363 A1* | 8/2007 | Wang et al. .............. 428/800 |
| 2007/0215715 A1 | 9/2007 | Fukui et al. |
| 2008/0089832 A1* | 4/2008 | Aoki et al. .............. 423/608 |
| 2008/0248265 A1* | 10/2008 | Naono et al. ............ 428/209 |
| 2008/0278038 A1* | 11/2008 | Kobayashi et al. ...... 310/358 |
| 2008/0302658 A1* | 12/2008 | Sasaki et al. ............ 204/400 |
| 2009/0085443 A1* | 4/2009 | Hishinuma et al. ...... 310/364 |

FOREIGN PATENT DOCUMENTS

| | | |
|---|---|---|
| JP | 2005-39166 | 2/2005 |
| JP | 2005-47745 | 2/2005 |

OTHER PUBLICATIONS

Kwi Young Yun, et al., "Giant Ferroelectric Polarization Beyond 150 μC/cm2 in BiFeO3 Thin Film", Japanese Journal of Applied Physics, vol. 43, No. 5A, 2004, pp. L647-L648.

* cited by examiner

PIEZOELECTRIC ELEMENT CONTAINING PEROVSKITE TYPE OXIDE, AND LIQUID JET HEAD AND ULTRASONIC MOTOR USING THE PIEZOELECTRIC ELEMENT

This application is a divisional of application Ser. No. 11/852,878, filed Sep. 10, 2007, the contents of which are incorporated herein by reference.

BACKGROUND OF THE INVENTION

1. Field of the Invention

The present invention relates to a piezoelectric element, and a liquid jet head and an ultrasonic motor in which the piezoelectric element is used.

2. Description of the Related Art

Researches have been carried out so that a ferroelectric material and a dielectric material are formed into thin films and used as piezoelectric elements in micro electro mechanical systems (MEMS). Especially, researches are intensively carried out so that an $ABO_3$ perovskite type oxide is formed into a film and put to practical use as the piezoelectric element. Attempts are made to control crystal orientation of the perovskite type oxide and improve characteristics of the element.

For example, in Japanese Patent Application Laid-Open No. H06-350154, an example of the piezoelectric element as a bulk is disclosed. The element has a PZT film of rhombohedral structure or tetragonal structure including lead zirconate titanate (hereinafter referred to as PZT in some case) usually having a composition in a composition range of the tetragonal structure. Moreover, these piezoelectric elements are characterized in that {111} orientation is 70% or more in a direction vertical to the main surface of a substrate in a case where the PZT film is of the rhombohedral structure. Moreover, {001} orientation is similarly 70% or more in a case where the film is of the tetragonal structure.

However, since the material contains Pb as an atom in an A-site, an influence on the environmental is regarded as a problem. To solve the problem, in Japanese Patent Application Laid-Open No. 2005-039166, there is proposed a piezoelectric element in which a $BiFeO_3$ perovskite type oxide is used.

A $BiFeO_3$ compound disclosed in Japanese Patent Application Laid-Open No. 2005-039166 is also disclosed as a material having a large remanent polarization in "Japanese Journal of Applied Physics" 2004, Vol. 43, No. 5A, L647v, and "Science", 14 Mar. 2003, Vol. 299, No. 5613, p. 1719, and the like. However, it is described that an element other than Fe is used as a dopant, but a piezoelectric material in which a B-site atom is the atom of the element other than Fe is not described.

Moreover, considering that $PbTiO_3$ having the large remanent polarization is not preferably used as the piezoelectric material, it is supposed that the characteristic of a high performance cannot be developed with $BiFeO_3$ only. It is actually disclosed in the invention of Japanese Patent Application Laid-Open No. 2005-039166 described above that atoms of elements such as Mn, Rn, Co, Ni, V, Nb, Ta, W, Ti, Zr and Hf are added as B-site atoms. However, a structure of the tetragonal structure or the rhombohedral structure is only used. Therefore, any displacement characteristic or optical characteristic in a region where a piezoelectric characteristic is improved is no used.

SUMMARY OF THE INVENTION

An object of the present invention is to provide a piezoelectric element in which a non-lead series piezoelectric body having an excellent piezoelectric characteristic is used, and a liquid jet head and an ultrasonic motor each having the piezoelectric element.

The above object is achieved by a piezoelectric element having, on a substrate, a piezoelectric body and a pair of electrodes which come in contact with the piezoelectric body, wherein the piezoelectric body consists of a perovskite type oxide represented by the following formula (1):

$$(Bi,Ba)(M,Ti)O_3 \qquad (1),$$

in which M is an atom of one element selected from the group consisting of Mn, Cr, Cu, Sc, In, Ga, Yb, Al, Mg, Zn, Co, Zr, Sn, Nb, Ta and W, or a combination of the atoms of the plurality of elements.

Moreover, the object is achieved by a piezoelectric element having, on a substrate, a piezoelectric body and a pair of electrodes which come in contact with the piezoelectric body, wherein the piezoelectric body consists of a perovskite type oxide represented by the following formula (3):

$$(Bi,Ba)(M',M'',Cu)O_3 \qquad (3),$$

in which M' is an atom of one element selected from the group consisting of Nb, Ta and W, and M'' is one or more atoms of elements selected from the group consisting of Mn, Sc, In, Ga, Yb, Al, Mg, Zn, Zr, Fe and Sn.

Furthermore, the object is achieved by a liquid jet head or an ultrasonic motor having the piezoelectric element of the present invention.

According to the present invention, a piezoelectric element can be provided in which a non-lead series piezoelectric body having an excellent piezoelectric characteristic is used. A liquid jet head including the piezoelectric element and having a large jet force, and an ultrasonic motor having the piezoelectric element can be provided.

Further features of the present invention will become apparent from the following description of exemplary embodiments with reference to the attached drawings.

DESCRIPTION OF THE EMBODIMENTS

A piezoelectric element of the present invention is a piezoelectric element having, on a substrate, a piezoelectric body and a pair of electrodes which come in contact with the piezoelectric body. Moreover, the piezoelectric body consists of a perovskite type oxide represented by the following formula (1):

$$(Bi,Ba)(M,Ti)O_3 \quad (1),$$

in which M is an atom of one element selected from the group consisting of Mn, Cr, Cu, Sc, In, Ga, Yb, Al, Mg, Zn, Co, Zr, Sn, Nb, Ta and W, or a combination of the atoms of the plurality of elements.

Moreover, in the piezoelectric element of the present invention, the piezoelectric body comprises a perovskite type oxide represented by the following formula (3):

$$(Bi,Ba)(M',M'',Cu)O_3 \quad (3)$$

in which M' is an atom of one element selected from the group consisting of Nb, Ta and W, and M'' is one or more atoms of elements selected from the group consisting of Mn, Sc, In, Ga, Yb, Al, Mg, Zn, Zr, Fe and Sn.

An embodiment of the present invention will be described with reference to the drawings.

Figure 1:
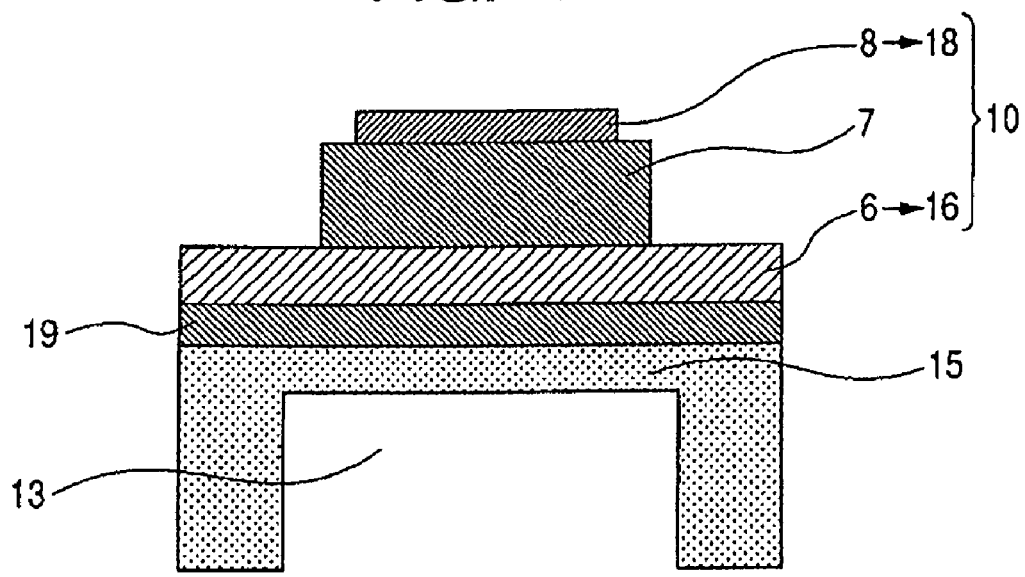
FIG. 1 is a schematic sectional view of a piezoelectric element portion in a width direction according to one example of an embodiment of a liquid jet head of the present invention.
Figure 2:
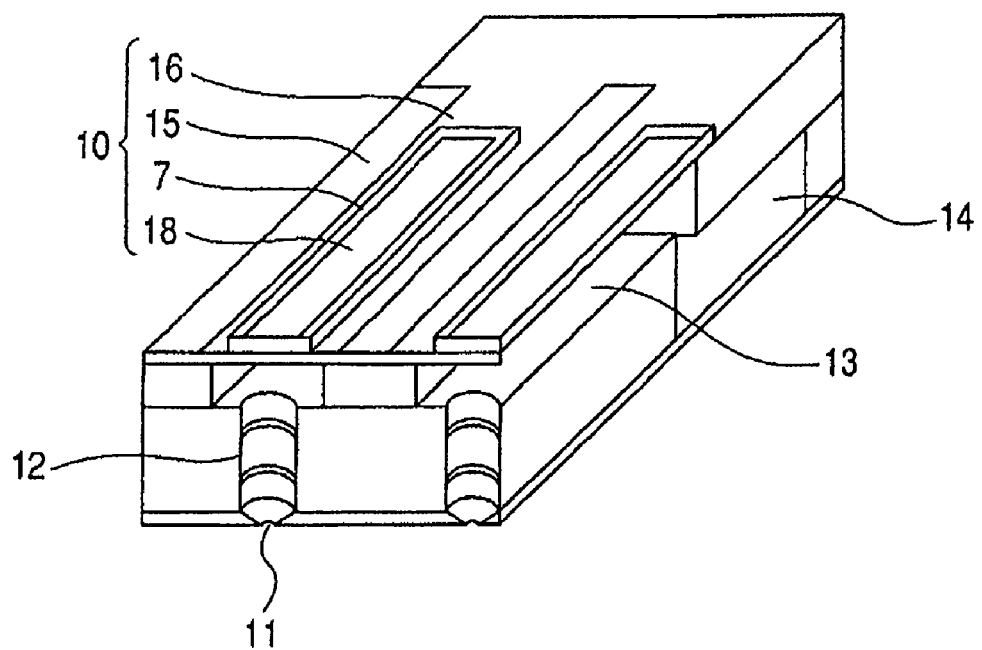
FIG. 2 is a schematic diagram illustrating one example of the embodiment of the liquid jet head according to the present invention.

FIG. 1 is a schematic sectional view of a piezoelectric element portion in a width direction according to one example of an embodiment of a liquid jet head of the present invention, and FIG. 2 is a schematic diagram illustrating one example of the embodiment of the liquid jet head according to the present invention.

According to one example of the embodiment of the present invention, as shown in FIG. 1, the piezoelectric element has, on a substrate 15, at least a first electrode 6, a piezoelectric body 7 and a second electrode 8. A piezoelectric element 10 may have a buffer layer 19 formed on the substrate 15. As shown in FIG. 2, the piezoelectric body 7 is patterned, if necessary.

As described above, the piezoelectric body 7 of the piezoelectric element 10 according to the present invention includes a perovskite type oxide represented by the following formula (1):

$$(Bi,Ba)(M,Ti)O_3 \quad (1),$$

or the following formula (3):

$$(Bi,Ba)(M',M'',Cu)O_3 \quad (3).$$

A piezoelectric element having an excellent piezoelectric characteristic can be obtained from such a piezoelectric body.

The bismuth barium titanate based oxide represented by the above formula (1) is an $ABO_3$ perovskite type oxide.

In the above formula (1), M is an atom of an element constituting a B-site of the perovskite type oxide represented by the above formula (1), or a combination of the atoms of the plurality of elements. In the present invention, the element is selected from the group consisting of Mn, Cr, Cu, Sc, In, Ga, Yb, Al, Mg, Zn, Co, Zr, Sn, Nb, Ta and W. When M is the combination of the atoms of the plurality of elements and the atom of the element to be selected is a tervalent atom, a ratio of these atoms can be an arbitrary ratio. When the atoms of the elements to be selected have different valences, the atoms may be combined so as to obtain an average valence of tervalent. In addition, examples of the tervalent atom of the element include Mn, Cr, Co, Sc, In, Ga, Yb and Al atoms. Examples of a bivalent atom include Mg, Zn and Cu atoms. Furthermore, examples of a quadrivalent atom include Zr and Sn atoms. Examples of a pentavalent atom include Nb and Ta atoms. Examples of a hexavalent atom include a W atom.

Moreover, in the formula (3), M' is an atom of one element selected from the group consisting of Nb, Ta and W, and M'' is one or more atoms of elements selected from the group consisting of Mn, Sc, In, Ga, Yb, Al, Mg, Zn, Zr, Fe and Sn.

The piezoelectric body of the present invention includes an $ABO_3$ type oxide, A-site elements include bivalent and tervalent cations, and B-site elements including composite series include a combination of elements of tervalent and quadrivalent cations. When the composite series elements have tervalent atoms, it is meant that a combination of bivalent and pentavalent cations has a composition of bivalent×⅔+pentavalent×⅓ and has the whole valence of tervalent.

Specific examples of the perovskite type oxide constituting the piezoelectric body of the present invention and represented by the above formula (1) include the following bismuth barium titanate based oxides.

(a) $(Bi,Ba)(M^{+3},Ti)O_3$ series $(Bi,Ba)(Mn,Ti)O_3$, $(Bi,Ba)(Cr,Ti)O_3$, $(Bi,Ba)(Co,Ti)O_3$, $(Bi,Ba)(Sc,Ti)O_3$, $(Bi,Ba)(In,Ti)O_3$, $(Bi,Ba)(Ga,Ti)O_3$, $(Bi,Ba)(Yb,Ti)O_3$, $(Bi,Ba)(Mn,Sc,Ti)O_3$, $(Bi,Ba)(In,Sc,Ti)O_3$, $(Bi,Ba)(Mn,Yb,Ti)O_3$ (b) $(Bi,Ba)(M^{+2},M'^{+4},Ti)O_3$ series $(Bi,Ba)\{(Mg_{1/2},Zr_{1/2}),Ti\}O_3$, $(Bi,Ba)\{(Zn_{1/2},Zr_{1/2}),Ti\}O_3$, $(Bi,Ba)\{(Mg_{1/2},Ti_{1/2}),Ti\}O_3$, $(Bi,Ba)\{(Zn_{1/2},Ti_{1/2}),Ti\}O_3$, $(Bi,Ba)\{(Mg_{1/2},Sn_{1/2}),Ti\}O_3$, $(Bi,Ba)\{(Cu_{1/2},Sn_{1/2}),Ti\}O_3$, $(Bi,Ba)\{(Mg_{1/4},Zn_{1/4},Ti_{1/2}),Ti\}O_3$, $(Bi,Ba)\{(Mg_{1/4},Co_{1/2},Ti_{1/4}),Ti\}O_3$, $(Bi,Ba)\{(Mg_{1/4},Zn_{1/4},Zr_{1/2}),Ti\}O_3$ (c) $(Bi,Ba)\{(M_{2/3}^{+2},M'_{1/3}^{+5}),Ti\}O_3$ series $(Bi,Ba)\{(Mg_{2/3},Nb_{1/3}),Ti\}O_3$, $(Bi,Ba)\{(Zn_{2/3},Nb_{1/3}),Ti\}O_3$, $(Bi,Ba)\{(Zn_{2/3},Ta_{1/3}),Ti\}O_3$, $(Bi,Ba)\{(Cu_{2/3},Ta_{1/3}),Ti\}O_3$, $(Bi,Ba)\{(Mg_{2/3},Ta_{1/3}),Ti\}O_3$, $(Bi,Ba)\{(Co_{2/3},Nb_{1/3}),Ti\}O_3$, $(Bi,Ba)\{(Mg_{1/3},Zn_{1/3},Nb_{1/3}),Ti\}O_3$, $(Bi,Ba)\{(Mg_{1/3},Co_{1/3},Nb_{1/3}),Ti\}O_3$, $(Bi,Ba)\{(Mg_{2/3},Nb_{1/6},Ta_{1/6}),Ti\}O_3$ (d) $(Bi,Ba)\{(M_3/4^{+2},M'_{1/4}^{+6}),Ti\}O_3$ series $(Bi,Ba)\{(Mg_{3/4},W_{1/4}),Ti\}O_3$, $(Bi,Ba)\{(Co_{3/4},W_{1/4}),Ti\}O_3$, $(Bi,Ba)\{(Mg_{3/8},Co_{3/8},W_{1/4}),Ti\}O_3$ In the present invention, in a case where the piezoelectric body is formed of the bismuth barium titanate based oxide represented by the above formula (1) which is the perovskite type oxide, a material of $BaTiO_3$ or $BiMO_3$ series can be used. As a composition, the perovskite type oxide constituting the formed piezoelectric body and represented by the above formula (1) can have a composition of a morphotropic phase boundary (hereinafter referred to as the MPB in some case) having an excellent characteristic. When the piezoelectric body is formed of such a perovskite type oxide, a difference between the maximum polarizability and a remanent polarization increases. Furthermore, permittivity increases and piezoelectric characteristic improves.

When the composition of the bismuth barium titanate based oxide represented by the above formula (1) is the composition of the MPB region, the piezoelectric body of the present invention can be constituted as a piezoelectric body in which at least two crystal phases are mixedly present (mixed phases). The piezoelectric body can be a piezoelectric body in which crystal phases of at least two of tetragonal structure, rhombohedral structures, pseudo-cubic structure, rhombic system and monoclinic structure are mixedly present as the crystal phases (mixed phases). In consequence, the piezoelectric characteristic can be improved.

Furthermore, the piezoelectric body of the present invention includes a piezoelectric body containing 1 wt % or less of Pb as impurities, but the piezoelectric body does not substantially contain Pb. When such a piezoelectric body is constituted, problems concerning the environment can further be reduced.

As described above, one of the piezoelectric bodies according to the present invention is a piezoelectric body including the perovskite type oxide represented by the following formula (1):

$$(Bi,Ba)(M,Ti)O_3 \qquad (1).$$

Figure 3A:
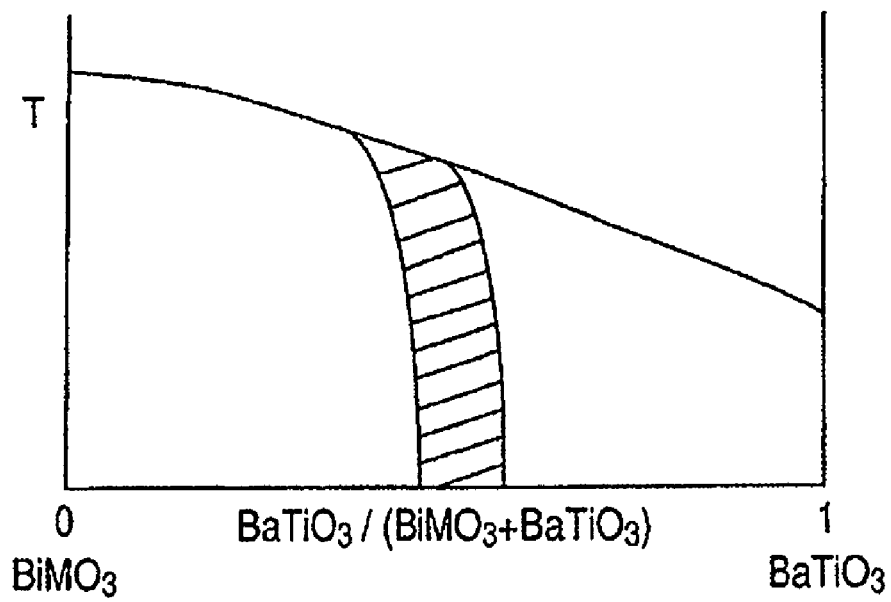
FIG. 3A is a schematic phase diagram of one example of a $BiMO_3/BaTiO_3$ series piezoelectric material according to the present invention.

This perovskite type oxide includes two components of $BiMO_3$ and $BaTiO_3$. FIG. 3A illustrates a schematic phase diagram of one example of series of two components of $BiMO_3$ and $BaTiO_3$.

In FIG. 3A, the abscissa indicates a composition ratio $(BaTiO_3/(BiMO_3/BaTiO_3))$ of the formed piezoelectric material, and the ordinate indicates temperature T. A hatched part of FIG. 3 is the MPB region which is a region where a plurality of crystal phases is mixedly present. The composition range of this MPB region changes with a type of the constituting component, a method of preparing a piezoelectric film and a type of the substrate for use. Therefore, the composition range of the MPB region is not determined by the type of the constituting component only. Even with the same composition, the MPB region widens or narrows.

In a composition range including a large amount of $BaTiO_3$ as compared with the MPB region, the crystal phase is tetragonal structure. However, in a composition range including a large amount of $BiMO_3$ as compared with the MPB region, the crystal phases are the rhombohedral structure, the pseudo-cubic structure, the rhombic system and the like, depending on selection of $BiMO_3$.

Furthermore, the rhombic system sometimes appears in the MPB region, and the crystal structure of the piezoelectric film according to the present invention sometimes includes the rhombic system.

The region where a plurality of crystal phases are mixed (mixedly present) is the MPB region, but the composition range of the MPB region changes with the type of the substrate for use, a method of forming the piezoelectric body and the like. Therefore, in the present invention, a fluctuation of the composition can be set to be within ±4%, more preferably ±3% from a central composition of the mixed phase region.

More specifically, the piezoelectric element of the present invention is a piezoelectric element having a piezoelectric body represented by the following formula (2) or (4):

in which M is one or more atoms of elements selected from the group consisting of Mn, Sc, In, Ga, Yb, Mg, Al, Zn, Zr and Sn, and X is a real number of 0<x<1, or

in which M' is an atom of one element selected from the group consisting of Nb, Ta and W, M" is one or more atoms of elements selected from the group consisting of Mn, Sc, In, Ga, Yb, Al, Mg, Zn, Zr, Fe and Sn, and Y is a real number of 0<Y<1.

The present invention is characterized in that a $BiMO_3$-based material is added to Ba-based material, and used in the MPB region composition. Owing to the MPB region, the difference between the maximum polarizability and the remanent polarization increases, the permittivity increases and the piezoelectric characteristic improves. The Ba-based material is a combination of materials having crystal phases of tetragonal structure, and the Bi-based material is a combination of materials having crystal phases of non-tetragonal structure. Especially, a Ba compound of the oxide represented by the general formula (4) has a high Curie temperature, and a non-lead-based piezoelectric body having a high Curie temperature is constituted.

In the MPB region, a film is formed in which at least two or more crystal structures are mixed. In the crystal structure, at least two of the tetragonal structure, the rhombohedral structure, the pseudo-cubic structure, the rhombic system and the monoclinic structure are mixedly present. In the MPB region, the permittivity increases to twofold or more as compared with a compound to be combined. Therefore, the composition (i.e., values of X and Y described above) of the MPB region can be determined. When the piezoelectric body is a film and the crystal phases are mixedly present, a mixing ratio of the crystal phases gradually can change in a thickness direction of the piezoelectric body.

Moreover, the oxide is an element having {100}, {110} or {111} uniaxial orientation or {100}, {110} or {111} single crystal. Here, for example, "{100}" means (100), (010), (001) or the like even in the tetragonal structure or the like.

It is meant that 70% or more, preferably 80% or more of the uniaxial orientation is included in the total of a specific orientation (here, (100), (110) or {111}) and another orientation according to θ-2θ measurement of X-ray analysis. An upper limit of the value is 99.9% or less.

Especially, the oxide has the (100) orientation, and has the crystal phases of at least two of the tetragonal structure, the pseudo-cubic structure, the rhombic system and monoclinic structure. Preferably, two crystal phases are the tetragonal structure and the pseudo-cubic structure, or the tetragonal structure and the rhombohedral structure.

When the piezoelectric body of the present invention is a film, as a way how the crystal phases are mixedly present, the mixing ratio of the mixedly present crystal phases can gradually change in the thickness direction of the film. A thin film can have a large ratio of tetragonal structure on one surface side, and a small ratio on the other surface side. In a further preferable structure, the surface of the structure on a substrate side has a large ratio of the tetragonal structure, and the other surface has a small ratio of the tetragonal structure. Especially, the film can have a large ratio of the tetragonal structure on the substrate side. This is because a satisfactory piezoelectric characteristic is secured, while a close contact property between the film and the lower electrode further improves. It is to be noted that such a piezoelectric film can be prepared by a sputtering process or the like by use of a thin film forming method which is influenced by a lattice of the substrate and in which the film can be epitaxially grown and formed.

When the piezoelectric body of the present invention is a film, the film can have a thickness of 1.0 μm or more and 15 μm or less. If the film thickness is less than 1.0 μm and the film is used as a liquid jet head according to one embodiment of the present invention, an element having a small jet force results. If the film thickness is in excess of 15 μm, the film is not suitable for miniaturization in application to MEMS.

Therefore, when the piezoelectric body of the present invention has a film thickness of 1.0 μm or more and 15 μm or less, the piezoelectric element is effective as the liquid jet head. The film thickness is preferably 1.5 μm or more and 10 μm or less.

In a case where the piezoelectric body of the present invention is a bulk body, there is not any special restriction on the size, and the thickness is in excess of 15 μm. When the piezoelectric body is applied to a device, the body may be manufactured in such a size as to obtain a satisfactory efficiency and cost merit. The bulk body may be polished into a thickness which is less than 50 µm for use.

When the piezoelectric body of the present invention is a film, the film can be formed on the electrode disposed on the substrate. As the film forming method, a thin film forming method such as a sol-gel process, a sputtering process or an MO-CVD process can be used.

When the piezoelectric body of the present invention is a bulk, the body is manufactured by sintering and the orientation of the body is controlled, a template grain growth (TGG) process or a reactive template grain growth (RTGG) process can be used. When such a manufacturing process is used, modified particles having a high aspect ratio can be used as seed particles. Especially, plate-like particles having an aspect ratio of 3 or more and less than 20 and including a Bi layered compound or $BaTiO_3$ plate-like oriented particles can be used. An amount of the particles to be added can be set to 20 wt % or more and 95 wt % or less. To manufacture a bulk-like single crystal, a flux process or a top seeded solution growth (TSSG) process may be used.

Specific examples of the perovskite type oxide according to the present invention will be described. Examples of the oxide represented by the general formula (2) are as follows: $BaTiO_3$—$BiAlO_3$, $BaTiO_3$—$BiScO_3$, $BaTiO_3$—$BiInO_3$, $BaTiO_3$—$BiMnO_3$, $BaTiO_3$—$BiYbO_3$, $BaTiO_3$—$BiGaO_3$, $BaTiO_3$—$Bi(Mg_{1/2},Ti_{1/2})O_3$, $BaTiO_3$—$Bi(Mg_{1/2},Sn_{1/2})O_3$, $BaTiO_3$—$Bi(Zn_{1/2},Ti_{1/2})O_3$ $BaTiO_3$—$Bi(Mg_{1/2},Zr_{1/2})O_3$, $BaTiO_3$—$Bi(Zn_{1/2},Zr_{1/2})O_3$ $BaTiO_3$—$Bi(Zn_{1/4},Mg_{1/4},Zr_{1/2})O_3$, $BaTiO_3$—$Bi(Zn_{1/4},Mg_{1/4},Ti_{1/2})O_3$ and the like.

Examples of the oxide represented by the general formula (4) are as follows: $Ba(Cu_{1/3},Nb_{2/3})O_3$—$BiAlO_3$, $Ba(Cu_{1/3},Nb_{2/3})O_3$—$BiMnO_3$ $Ba(Cu_{1/3},Nb_{2/3})O_3$—$BiGaO_3$, $Ba(Cu_{1/3},Nb_{2/3})O_3$—$BiScO_3$, $Ba(Cu_{1/3},Nb_{2/3})O_3$—$BiYbO_3$, $Ba(Cu_{1/3},Nb_{2/3})O_3$—$BiInO_3$, $Ba(Cu_{1/3},Nb_{2/3})O_3$—$Bi(Mg_{1/2},Ti_{1/2})O_3$ $Ba(Cu_{1/3},Nb_{2/3})O_3$—$Bi(Mg_{1/2},Sn_{1/2})O_3$, $Ba(Cu_{1/3},Nb_{2/3})O_3$—$Bi(Mg_{1/2},Zr_{1/2})O_3$ $Ba(Cu_{1/3},Nb_{2/3})O_3$—$Bi(Zn_{1/2},Ti_{1/2})O_3$, $Ba(Cu_{1/3},Nb_{2/3})O_3$—$Bi(Zn_{1/2},Zr_{1/2})O_3$ $Ba(Cu_{1/3},Nb_{2/3})O_3$—$Bi(Zn_{1/4},Mg_{1/4},Zr_{1/2})O_3$ $Ba(Cu_{1/3},Nb_{2/3})O_3$—$Bi(Zn_{1/4},Mg_{1/4},Ti_{1/2})O_3$ $Ba(Cu_{1/3},Ta_{2/3})O_3$—$BiAlO_3$, $Ba(Cu_{1/3},Ta_{2/3})O_3$—$BiMnO_3$ $Ba(Cu_{1/3},Ta_{2/3})O_3$—$BiGaO_3$, $Ba(Cu_{1/3},Ta_{2/3})O_3$—$BiScO_3$, $Ba(Cu_{1/3},Ta_{2/3})O_3$—$BiYbO_3$, $Ba(Cu_{1/3},Ta_{2/3})O_3$—$BiInO_3$, $Ba(Cu_{1/3},Ta_{2/3})O_3$—$Bi(Mg_{1/2},Ti_{1/2})O_3$ $Ba(Cu_{1/3},Ta_{2/3})O_3$—$Bi(Mg_{1/2},Sn_{1/2})O_3$, $Ba(Cu_{1/3},Ta_{2/3})O_3$—$Bi(Mg_{1/2},Zr_{1/2})O_3$ $Ba(Cu_{1/3},Ta_{2/3})O_3$—$Bi(Zn_{1/2},Ti_{1/2})O_3$, $Ba(Cu_{1/3},Ta_{2/3})O_3$—$Bi(Zn_{1/2},Zr_{1/2})O_3$ $Ba(Cu_{1/3},Ta_{2/3})O_3$—$Bi(Zn_{1/4},Mg_{1/4},Zr_{1/2})O_3$ $Ba(Cu_{1/3},Ta_{2/3})O_3$—$Bi(Zn_{1/4},Mg_{1/4},Ti_{1/2})O_3$ $Ba(Cu_{1/2},W_{1/2})O_3$—$BiAlO_3$, $Ba(Cu_{1/2},W_{1/2})O_3$—$BiMnO_3$ $Ba(Cu_{1/2},W_{1/2})O_3$—$BiGaO_3$, $Ba(Cu_{1/2},W_{1/2})O_3$—$BiScO_3$, $Ba(Cu_{1/2},W_{1/2})O_3$—$BiYbO_3$, $Ba(Cu_{1/2},W_{1/2})O_3$—$BiInO_3$, $Ba(Cu_{1/2},W_{1/2})O_3$—$Bi(Mg_{1/2},Ti_{1/2})O_3$ $Ba(Cu_{1/2},W_{1/2})O_3$—$Bi(Mg_{1/2},Sn_{1/2})O_3$, $Ba(Cu_{1/2},W_{1/2})O_3$—$Bi(Mg_{1/2},Zr_{1/2})O_3$ $Ba(Cu_{1/2},W_{1/2})O_3$—$Bi(Zn_{1/2},Ti_{1/2})O_3$, $Ba(Cu_{1/2},W_{1/2})O_3$—$Bi(Zn_{1/2},Zr_{1/2})O_3$ $Ba(Cu_{1/2},W_{1/2})O_3$—$Bi(Zn_{1/4},Mg_{1/4},Zr_{1/2})O_3$ $Ba(Cu_{1/2},W_{1/2})O_3$—$Bi(Zn_{1/4},Mg_{1/4},Ti_{1/2})O_3$ and the like.

The structure of the crystal phase of the piezoelectric body according to the present invention can be measured by an X-ray diffraction process or Raman scattering spectroscopy. It can be measured by such a method whether the crystal phase present in the piezoelectric body includes one crystal phase or a mixed phase where two or more crystal phases are mixedly present. The orientation of the crystal phase of the piezoelectric body can be measured by the X-ray diffraction process. The composition of the piezoelectric body may be analyzed by a fluorescent X-ray analysis (XRF) process or an inductively coupled plasma emission spectrometry process (an ICP mass analysis process).

Figure 3B:
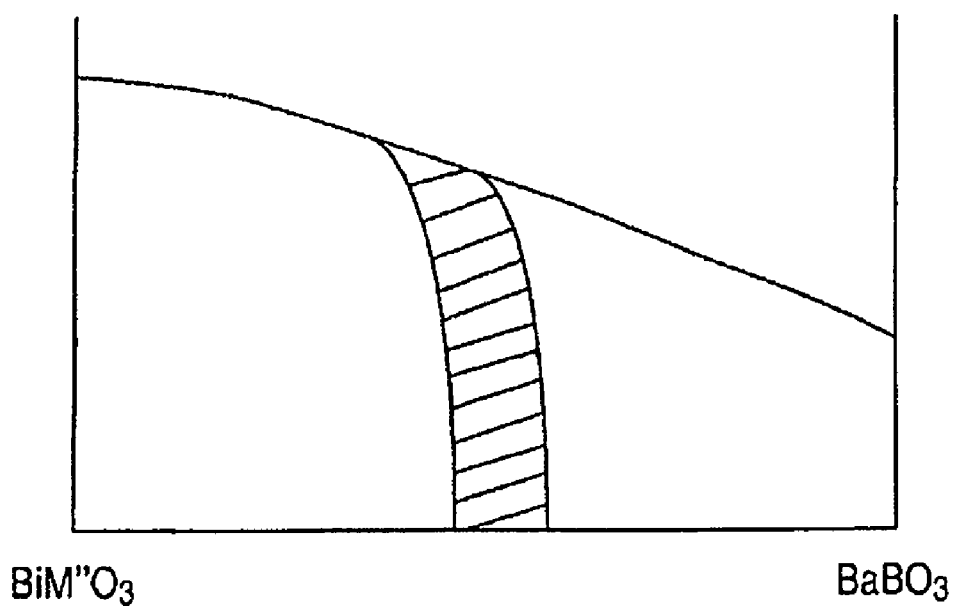
FIG. 3B is a schematic phase diagram of one example of a $BiM''O_3/BaBO_3$ series piezoelectric material according to the present invention.

The piezoelectric body of the present invention is a piezoelectric body in which an A-site element is a material including Ba, Bi and having a mixed phase as shown in FIG. 3B. FIG. 3B is a schematic phase diagram of a $BiM''O_3/BaBO_3$-based material. A hatched part is a mixed phase part of the MPB region. This composition range widens or narrows in accordance with the material and the manufacturing process. In the phase diagram, a structure of the tetragonal structure is adopted on a $BaBO_3$ side from the MPB. However, on a $BiMO_3$ side, a different crystal structure of the rhombohedral structure, the pseudo-cubic structure, the rhombic system or the like is adopted in accordance with the material. The rhombic system sometimes appears in the MPB region, and the crystal structure of the film of the present invention also includes the monoclinic structure. This also applies to the material represented by the general formula (4), $Ba(Cu,M')O_3$ employs the tetragonal structure, and $BiM''O_3$ employs the non-tetragonal structure.

The region where the crystal phases are mixedly present is the MPB region, but the composition range of the MPB region changes with the substrate type and the manufacturing process. Therefore, the present invention may be a film having a composition fluctuation of ±4% from the center of the mixed phase region. The fluctuation is preferably within ±3%.

It can be determined by the X-ray diffraction process whether the crystal orientation of the piezoelectric film is {100}, {110} or {111}. To analyze the composition of the piezoelectric film, the composition can be measured using the fluorescent X-ray analysis (XRF) process or the ICP mass analysis process.

When the piezoelectric body of the present invention is the film, the film can be structured so that the mixing ratio of the crystal phases gradually changes in the thickness direction of the film. Specifically, it can be constituted that the piezoelectric film of the present invention has a large ratio of the tetragonal structure on one surface side, and a small ratio of the tetragonal structure on the other surface side. Furthermore, it can further be constituted that the film has a large ratio of the tetragonal structure on the substrate-side surface, and a small ratio of the tetragonal structure on the other surface. The piezoelectric film having a large ratio of the tetragonal structure on the substrate side can further be used. When such a piezoelectric film is formed while heating the substrate, in a process of temperature drop after the film formation, a tensile or compressive stress is sometimes generated in the piezoelectric film owing to a difference of a linear expansion coefficient between the substrate and the piezoelectric film. At this time, when the piezoelectric film has a large ratio of the tetragonal structure on the substrate side, the tetragonal structure can take (100), (001) or (010) orientation. Therefore, when the presence ratio of (100), (001) or (010) is changed in accordance with the difference of the linear expansion coefficient between the substrate and the piezoelectric film, the stress of the piezoelectric film can be reduced, and the close contact property between the substrate and the piezoelectric film becomes satisfactory. Such a piezoelectric film is effective in a case where the film is epitaxially grown by a sputtering process in which the piezoelectric film is formed while heating the substrate.

Moreover, the crystal orientation of the piezoelectric film of the present invention can be a <100> single orientation or a <100> single crystal film. When the piezoelectric film is formed in this manner, a polarization axis is arranged for each of the mixedly present crystal phases, and the orientation is limited to a direction in which an electric field is effectively applied. Such a piezoelectric film can be prepared by epitaxially growing the film by, for example, a thin film preparing method such as the sputtering process while heating the substrate.

Figure 5A:
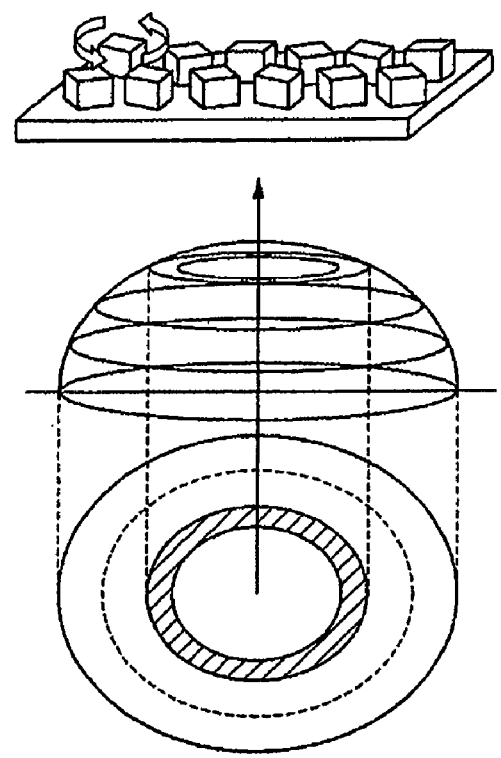
FIG. 5A is a conceptual diagram of a single oriented film.

The single orientation indicates the crystals having a single crystal orientation in the film thickness direction, and there is not any special restriction on an in-plane orientation of the crystal. For example, the <100> single orientation indicates a film including the crystals having the only <100> orientation in the film thickness direction. It can be confirmed using the X-ray diffraction whether or not the piezoelectric film has a single orientation. For example, in case of the <100> single orientation of a PZT perovskite type structure, during the 2θ/θ measurement of the X-ray diffraction, an only peak of a (L00) surface (L=1, 2, 3 . . . n: n is an integer) having the orientation {100}, {200} or the like is detected as a peak attributable to the piezoelectric film. When a polar point of a {110} asymmetric surface is measured, as shown in FIG. 5A, a ring-like pattern is obtained at the same radial position indicating a tilt of about 45° from the center.

Figure 5B:
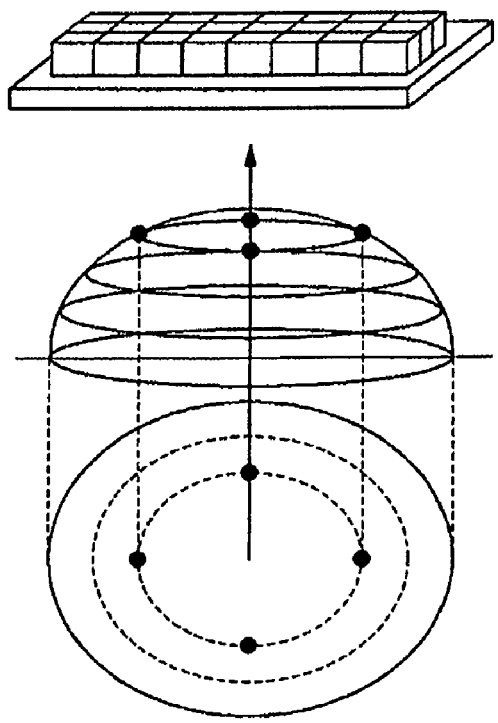
FIG. 5B is a single crystal film (B).

The single crystal film is a film of crystals having a single crystal orientation in a film thickness direction and a film in-plane direction. For example, the <100> single crystal film is a film including crystals having the only <100> orientation in the film thickness direction and having the only <110> orientation in a certain film in-plane direction. It can be confirmed by use of the X-ray diffraction whether or not the piezoelectric film has the single orientation. For example, in the <100> single crystal film of the PZT perovskite type structure, during the 2θ/θ measurement of the X-ray diffraction, an only peak of a (L00) surface (L=1, 2, 3 . . . n: n is an integer) having the orientation {100}, {120} or the like is detected as a peak attributable to the piezoelectric film. When a polar point of a {110} asymmetric surface is measured, as shown in FIG. 5B, a spot-like pattern which becomes symmetric four times every 90° is obtained at the same radial position indicating a tilt of about 45° from the center.

Moreover, in, for example, the PZT perovskite type structure having the <100> orientation, when the polar point of the {110} asymmetric surface is measured, a crystal pattern which becomes symmetric eight times or twelve times can sometimes be obtained at the same radial position indicating a tilt of about 45° from the center. Alternatively, the crystals sometimes have an elliptic pattern instead of the spot pattern. Since these crystals have intermediate symmetry between the single crystal film and the single oriented film, the crystals are regarded as the single crystal film and the single oriented film in a broad sense. Similarly, as in the present invention, in a state of the MPB region where a plurality of crystal phases of the monoclinic structure and the tetragonal structure, the monoclinic structure and the rhombohedral structure, the tetragonal structure and the rhombohedral structure, or all of the systems are mixedly present, in a case where the crystals attributable to a twin crystal are mixedly present or when there is dislocation, defect or the like, the film is regarded as the single crystal film or the single oriented film in the broad sense. Here, the plurality of mixedly present crystal phases (the mixed phases) do not indicate the plurality of crystal phases having different crystal axis directions and included in the form of polycrystal with the presence of a grain boundary. It is indicated that a plurality of crystal phases are present among particles of one perovskite type oxide. The crystals integrally form the single crystal or the single orientation.

Especially, it can be constituted that the piezoelectric film of the present invention has the <100> orientation and that the crystal phases of at least one of the tetragonal structure, the rhombohedral structure, the pseudo-cubic structure, the rhombic system and the monoclinic structure are mixedly present (the mixed phases). When such a piezoelectric film is constituted, the polarization axis is arranged for each of the mixedly present crystal phases. The direction in which the electric field is effectively applied can be limited. Furthermore, it can further be constituted that at least two mixedly present crystal phases (the mixed phases) are the tetragonal structure and the pseudo-cubic structure, or the tetragonal structure and the rhombohedral structure. In a case where such a piezoelectric film is formed while heating the substrate, the tensile or compressive stress is sometimes generated in the piezoelectric film owing to the difference of the linear expansion coefficient between the substrate and the piezoelectric film in the process of the temperature drop after the film formation. At this time, when the piezoelectric film has a large ratio of the tetragonal structure on the substrate side, the tetragonal structure can take (100), (001) or (010) orientation. Therefore, when the presence ratio of (100), (001) or (010) is changed in accordance with the difference of the linear expansion coefficient between the substrate and the piezoelectric film, the stress of the piezoelectric film can be reduced, and the close contact property between the substrate and the piezoelectric film becomes satisfactory. Such a piezoelectric film is effective in a case where the film is epitaxially grown by a sputtering process in which the piezoelectric film is formed while heating the substrate.

It is difficult to prepare the film having the mixed phase region by use of the perovskite type oxide represented by the formula (1), or the film cannot be prepared by a general manufacturing process of ceramics or bulk-like crystal growth.

When the piezoelectric body of the present invention is a film, the film can be formed on the substrate or the electrode formed on the substrate. As the film forming method, a thin film forming method such as the sol-gel process, the sputtering process or an organic metal gas phase growth process (hereinafter referred to as the MO-CVD process) can be used.

When the piezoelectric body of the present invention is a bulk, the body is manufactured by a manufacturing process by sintering and the orientation of the body is controlled, a template grain growth (TGG) process or a reactive template grain growth (RTGG) process can be used. When this manufacturing process is used, the modified particles having the high aspect ratio can be used as the seed particles. Especially, the plate-like particles having the aspect ratio of 3 or more and less than 20 and including the Bi layered compound or $BaTiO_3$ plate-like oriented particles can be used. The amount of the particles to be added can be set to 20 wt % or more and 95 wt % or less.

To manufacture the bulk-like single crystal, the flux process or the top seeded solution growth (TSSG) process may be used.

In the above thin film forming method, to crystallize the piezoelectric film formed on the substrate or the electrode formed on the substrate, the piezoelectric film, the substrate and the like are heated after or while the piezoelectric film is formed.

In a step of heating the piezoelectric film, the substrate and the like after or while the piezoelectric film is formed, and then returning temperature of the piezoelectric film, the substrate and the like to normal temperature, if there is a difference of the thermal expansion coefficient between the substrate and the piezoelectric film, a stress is generated between the substrate and the piezoelectric film. This is because the piezoelectric film is restricted by the substrate.

When the piezoelectric film formed on the substrate receives the compressive or tensile stress from the substrate in the process of the temperature drop, the crystal structure is stabilized to relax the stress. Since the piezoelectric film formed on the substrate is subjected to this stress relaxing process, it is considered that the film cannot be prepared by the general bulk-like piezoelectric body manufacturing process including the ceramics or bulk-like crystal growth. It is also considered that at least two crystal phases are mixedly present (the mixed phases) in the film as described above.

Finally, the piezoelectric film of the present invention receives the compressive or tensile stress (hereinafter referred to as the residual stress) from the substrate at the normal temperature or the use temperature of the piezoelectric element. From a viewpoint of the piezoelectric performance of the piezoelectric film, the stress can be set to a small absolute value. Specifically, the absolute value of the residual stress can usually be set to 300 MPa or less. The absolute value can more preferably be set to 150 MPa or less.

From a viewpoint that the piezoelectric film including the mixed phases be developed, a material of the substrate, a material of the piezoelectric film, temperature drop conditions and the like are selected. In this case, the residual stress is sometimes present in the piezoelectric film of the present invention at the normal temperature or the use temperature of the piezoelectric element.

When the piezoelectric body of the present invention is the film, a film thickness of the body can be set to 1.0 µm or more, 15 µm or less. The film thickness can be set to 1.5 µm or more, 10 µm or less. When the film thickness is 1.0 µm or more and the piezoelectric element of the present invention having the piezoelectric film is used in a liquid jet head of the present invention, the liquid jet head having a large jet force can be obtained. When the film thickness is set to 15 µm or less, the body is suitable for miniaturization in application to the MEMS. Therefore, when the film thickness of the piezoelectric film according to the present invention is set to 1.0 µm or more, 15 µm or less, the piezoelectric element suitable for the liquid jet head can be constituted. When the piezoelectric body of the present invention is a bulk body, there is not any special restriction on the size, and the thickness is in excess of 15 µm. When the piezoelectric body is used in a device, the device may be manufactured into such a size as to provide the satisfactory efficiency and the cost merit. The bulk body may be polished into a size which is less than 50 µm for use.

The piezoelectric element of the present invention can be manufactured by forming the first electrode 6 on at least the substrate 15, next forming the piezoelectric body 7 on the first electrode and further forming the second electrode 8 on the piezoelectric body. As shown in FIG. 1, after forming the buffer layer 19 on the substrate 15, the first electrode may be formed on the buffer layer.

When the piezoelectric body 7 is a single-crystal piezoelectric film, a single-crystal substrate can be used as the substrate 15 for use in the present invention. As the single-crystal substrate, an Si substrate, an SOI substrate, an $SrTiO_3$ substrate, an MgO substrate or the like can be used in the present invention. Among these substrates, the Si substrate or the SOI substrate can more preferably be used. When the piezoelectric body 7 is a single oriented film, the Si substrate, the SOI substrate, an SUS substrate, a metal substrate or a ceramic substrate can be used. The Si substrate or the SOI substrate can more preferably be used.

When an epitaxial piezoelectric film is to be obtained, the piezoelectric film can be formed via an epitaxial (100) oxide electrode film such as yttria stabilized zirconia (YSZ), $SrTiO_3$ or MgO formed on the Si substrate or SOI substrate. To form the piezoelectric film as the single oriented film, the piezoelectric film can be formed via a (100) oxide electrode of a face-centered cubic metal formed on the Si or SOI substrate. According to a preferable film forming method of obtaining the single oriented piezoelectric film, the layer constitution disposed on the Si substrate is oxide electrode/face-centered cubic metal oxide/$TiO_2$/$SiO_2$/Si, oxide electrode/face-centered cubic metal/Ta/$SiO_2$/Si or the like. Here, /$TiO_2$/ or /Ta/ is a close contact layer. The oxide electrode may be formed by laminating two or more layers.

In the piezoelectric element of the present invention, the first electrode 6 and the second electrode 8 may be upper and lower electrodes between which the piezoelectric body 7 is nipped as shown in FIG. 1, or comb teeth electrodes disposed on and under the same film surface of the piezoelectric body 7.

When the electrodes are disposed on and under the piezoelectric film, the first electrode is disposed on the substrate. A buffer layer for orientation control may be interposed between the first electrode and the substrate. As the buffer layer, a YSZ film, an $SrTiO_3$ film, an MgO film or the like can be used.

As the first electrode 6 and the second electrode 8 according to the present invention, an electrode formed of a metal material such as the face-centered cubic metal, a metal having a hexagonal close-packed structure or a body-centered cubic metal, or a conductive material such as the $ABO_3$ perovskite type oxide can be used.

Examples of the preferable face-centered cubic metal include Pt, Ir, Au, Ni and Cu. Examples of the preferable metal having the hexagonal close-packed structure include Ru, Ti and Os. Examples of the preferable body-centered cubic metal include Cr, Fe, W and Ta. A part of these metal materials may be formed into an oxide to such an extent that crystallinity or conductivity is not impaired. Especially, the outermost surface can be formed into the oxide. Because diffusion of lead in the piezoelectric film can be suppressed.

Examples of the preferable $ABO_3$ perovskite type oxide include $SrRuO_3$, $(La,Sr)CoO_3$, $BaPbO_3$, $(La,Sr)TiO_3$ and $LaNiO_3$.

Among these electrode materials, a plurality of materials may be used together. In this case, the first electrode or the second electrode may include two or more layers.

The film thickness of the first or second electrode can usually be set to 50 nm or more, 500 nm or less. The film thickness can more preferably be set to 100 nm or more, 400 nm or less. When the film thickness is set to 50 nm or more, the conductivity preferably improves. When the film thickness is set to 500 nm or less, a displacement amount of the piezoelectric element increases. The control of the crystallinity of the electrode is preferably facilitated.

Figure 4A:
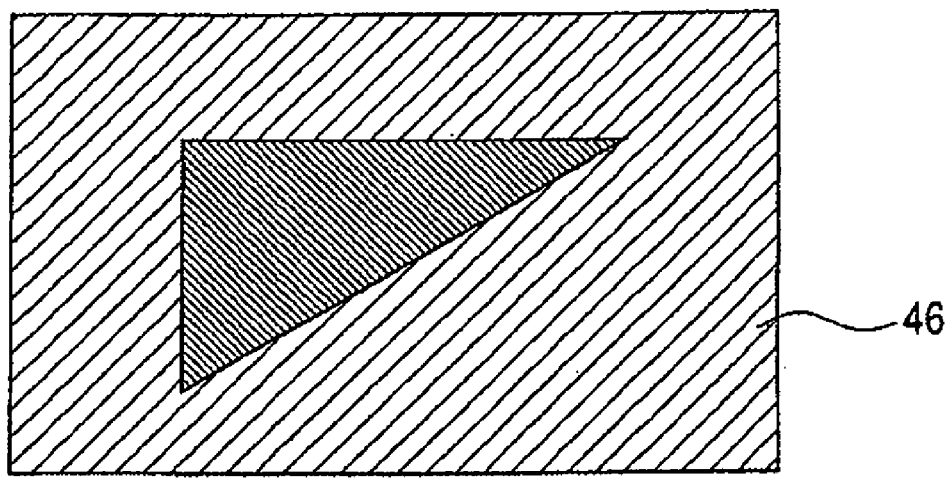
FIG. 4A is a schematic diagram illustrating a top plan view of one example of a scrub type light guide in which the piezoelectric element of the present invention is used and FIG. 4B is a sectional view of the example.
Figure 4B:
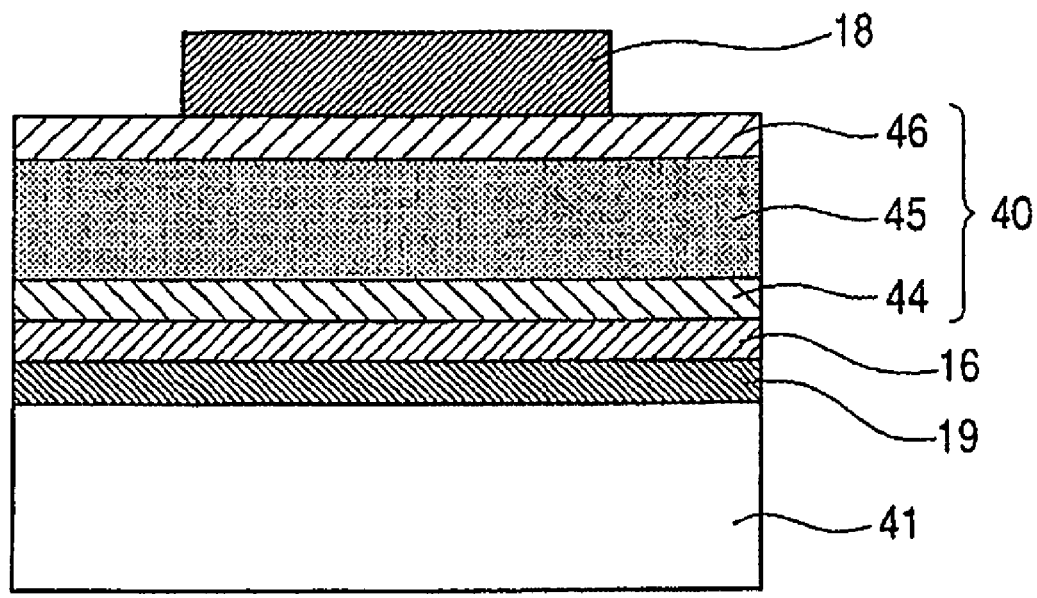

FIGS. 4A and 4B are schematic diagrams of a scrub type light guide according to one example of an optical element in which the piezoelectric element of the present invention is used. FIG. 4A is a schematic diagram viewed from the side of an upper electrode 18, and FIG. 4B is a schematic diagram viewed from a sectional direction. A light guide 40 includes clad layers 44, 46 and a core layer 45. A substrate 41 is preferably an Si substrate. A buffer layer 19 is used in forming an oriented film or an epitaxial film on the Si substrate. An electrode layer 16 is disposed. The upper electrode 18 is a polarization electrode. The piezoelectric film of the present invention is used as a core layer 45.

A liquid jet head of the present invention will be described with reference to FIGS. 1 and 2.

The liquid jet head of the present invention is a liquid jet head having the piezoelectric element according to the present invention described above. FIG. 2 is a schematic diagram of one example of the embodiment of the liquid jet head according to the present invention as described above. The liquid jet head of the embodiment shown in FIG. 2 includes a discharge port 11, a communication hole 12 which connects the discharge port 11 to an individual liquid chamber 13, and a common liquid chamber 14 which supplies a liquid to the individual liquid chamber 13. The liquid is supplied to the discharge port 11 along a communicating path. A part of the individual liquid chamber 13 includes a vibration plate 15. The piezoelectric element 10 which vibrates the vibration plate 15 is disposed outside the individual liquid chamber 13. When a voltage is applied from a power source (not shown) to the piezoelectric element 10 to drive the element, the vibration plate 15 is vibrated by the piezoelectric element 10 to discharge the liquid from the individual liquid chamber 13 via the discharge port 11.

As shown in FIG. 2, the piezoelectric element 10 has the piezoelectric body 7 patterned into a rectangular shape, but the piezoelectric body have a shape other than the rectangular shape, for example, an elliptic shape, a circular shape, a parallelogram shape or the like. In this case, the piezoelectric body 7 has a shape formed along the shape of the individual liquid chamber 13 of the liquid jet head.

The piezoelectric element 10 constituting the liquid jet head of the present invention will be described in more detail with reference to FIG. 1.

In the piezoelectric element 10 according to the embodiment shown in FIG. 1, the piezoelectric body 7 has a rectangular sectional shape, but may have a trapezoidal shape or an inverted trapezoidal shape. The first electrode 6 or the second electrode 8 constituting the piezoelectric element 10 of the present invention may correspond to the lower electrode 16 or the upper electrode 18 of the liquid jet head.

Similarly, the vibration plate 15 may include a part of the substrate 15 constituting the piezoelectric element 10 of the present invention. Such a difference is made according to a method of manufacturing the device, and in any case, an effect of the present invention can be obtained.

The buffer layer 19 may be disposed between the vibration plate 15 and the lower electrode 16. A film thickness of the buffer layer is usually 5 nm or more, 300 nm or less, preferably 10 nm or more, 200 nm or less.

In the liquid jet head, when the piezoelectric body 7 extends or contracts, the vibration plate 15 fluctuates vertically. In consequence, a pressure is applied to the liquid of the individual liquid chamber 13, and discharged from the discharge port 11.

A thickness of the vibration plate 15 is 1.0 μm or more, 15 μm or less, preferably 15 μm or more, 8 μm or less. As described above, the vibration plate 15 may include a part of the substrate. In this case, as described above, Si can be used as a material of the vibration plate. The buffer layer 19 and the electrode formed on the substrate may form a part of the vibration plate. The material Si of the vibration plate may be doped with B.

A size of the discharge port can usually be set to 5 μmΦ or more, 40 μmΦ or less. The discharge port usually has a circular shape, but may have a star-like shape, an angular shape or a triangular shape.

The liquid jet head of the present invention can be used in manufacturing an electronic device in addition to a printer.

An ultrasonic motor using the piezoelectric element of the present invention will be described.

Figure 6:
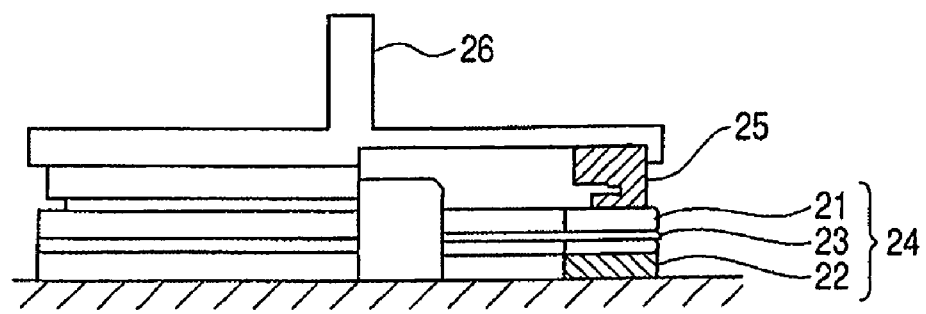
FIG. 6 is a sectional view illustrating an ultrasonic motor including a single-plate piezoelectric body.

The ultrasonic motor in which the piezoelectric body of the present invention includes a single plate is shown in FIG. 6. As shown in FIG. 6, the motor includes a vibrator 24 in which a piezoelectric element 22 of the present invention is bonded to a metal elastic ring 21 via an organic adhesive 23 (epoxy-based, cyanoacrylate-based or the like). The motor also includes a rotor 25 which comes in contact with a sliding surface of the vibrator 24 under a pressurizing force applied by a pressurizing spring (not shown), and an output shaft 26 disposed integrally with the rotor 25.

When an alternating-current voltage is applied from a two-phase (a phase difference of π/2) power source to the piezoelectric body of the present invention, a bent travel wave is generated in the vibrator 24, and each point of the sliding surface of the vibrator 24 elliptically moves. When the rotor 25 is brought into contact with the sliding surface of this vibrator 24 under pressure, the rotor 25 receives a frictional force from the vibrator 24, and rotates in a direction of the elliptic movement along the sliding surface of the vibrator. A member (not shown) to be driven is bonded to the output shaft 26 by coupling or the like, and driven under a rotation force of the rotor 25. In this type of motor, when the voltage is applied to the piezoelectric body, the piezoelectric body extends or contracts owing to a piezoelectric transverse effect. Therefore, when the piezoelectric element is bonded to an elastic material such as a metal beforehand, the elastic material can be bent. This principle is used in the present invention.

Figure 7:
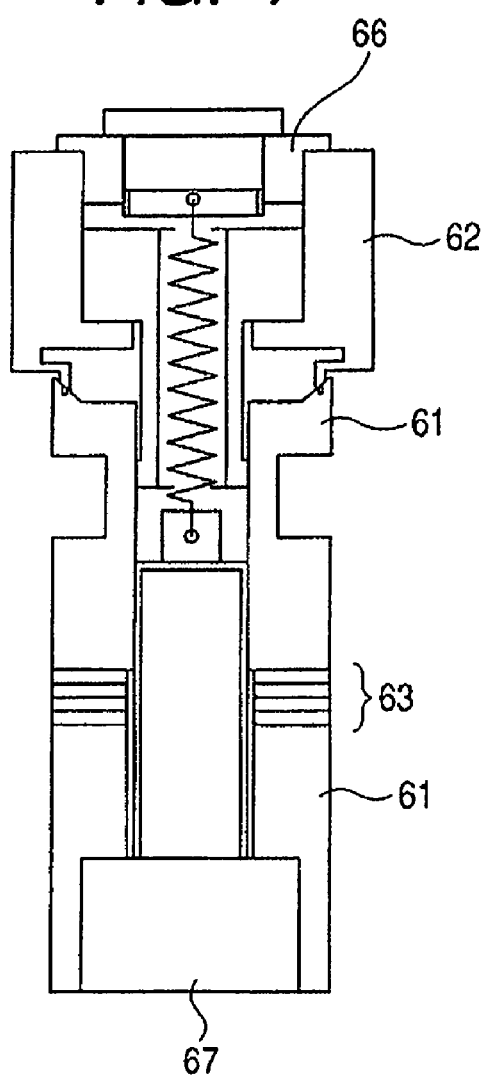
FIG. 7 is a sectional view illustrating an ultrasonic motor in which a laminated piezoelectric body is used.

Furthermore, FIG. 7 illustrates an ultrasonic motor in which the piezoelectric body has a laminated structure.

In FIG. 7, in a vibrator 61 formed of a metal material, a plurality of piezoelectric bodies 63 of the present invention are interposed between cylindrical metal blocks. These metal blocks are tightened with a bolt 67. In consequence, the plurality of piezoelectric bodies 63 are nipped and fixed to constitute the vibrator. When an alternating-current voltage having different phases is applied to the piezoelectric bodies for driving of the piezoelectric element, two vibrations crossing each other at right angles are excited, and the vibrations are synthesized to form circular vibration for driving at a tip end portion of the vibrator. It is to be noted that a constricted peripheral groove is formed at an upper part of the vibrator 61, and displacement of the vibration for driving is enlarged.

A rotor 62 comes in contact with the vibrator 61 under pressure from a spring S for pressurizing to obtain the frictional force for driving. A bearing 66 rotatably supports the rotor 62.

As described above, the piezoelectric element of the present invention is preferably used in the liquid jet head or the ultrasonic motor. As the liquid jet head, a head having a nozzle density and a jet force which are equal to or more than those of a lead-based material can be provided owing to a non-lead-based piezoelectric body including A-site elements of Ba and Bi.

Moreover, when the non-lead-based piezoelectric body including the A-site elements of Ba and Bi is incorporated into the ultrasonic motor, there can be provided the motor having a driving force and durability equal to or more than those of a lead-based material.

The present invention will be described in accordance with examples.

EXAMPLE 1

$X\{BaTiO_3\}\text{-}(1\text{-}X)\{Bi(Mg_{1/3},Ti_{2/3})O_3\}$ Thin Film

Barium titanate, bismuth oxide, magnesium oxide and niobium oxide were mixed and then compacted under heating and pressure to produce a target of a powder compact. Then, this powder compact was subjected to a sputtering process to form a film on an SOI (100) substrate on which an $SrRuO_3$ (100) epitaxial film was provided. During the film formation, the substrate was heated to 750° C., and the film formation by the sputtering process was carried out at Ar/O$_2$=10:1 in a 2 Pa atmosphere. In consequence, there was obtained a perovskite {100} epitaxial piezoelectric film of 3 μm in which Ba and Bi were placed in a site A, and Mg and Ti were placed in a site B.

The composition of the target was changed to form films in which Xs were about 0.9, 0.7, 0.5 and 0.3. On each film, an Au film was formed as an upper electrode, and properties of the film were evaluated. With respect to the change of a crystal phase, X in an MPB region in which tetragonal structure and rhombohedral structure were mixedly present was in a range of 0.7 to 0.5.

In this range, a dielectric constant was 650 which meant that it increased thrice. In the case of the upper electrode size of 100 μmφ, a $d_{33}$ piezoelectric constant was in excess of 150. In the MPB region, the tetragonal structure was present in large quantities on the side of the substrate, and the rhombohedral structure was present in large quantities on the upper side of the piezoelectric film, which was an inclinatory structure. On the side of the substrate, the tetragonal structure was present in a ratio of 60% by volume, and on the surface side of the piezoelectric film, the rhombohedral structure was present in a ratio of 60% by volume, which meant that the crystal phase was an inclinatory structure.

A handle layer of this SOI substrate was etched to provide individual liquid chambers 13, and the piezoelectric film was patterned to provide a liquid jet head shown in FIG. 2.

When 30 V was applied to the head, droplets of 5 pl to 6 pl could be jetted, whereby it was confirmed that the head had sufficiently satisfactory properties.

EXAMPLE 2

Y{Ba(Cu$_{1/3}$,Nb$_{2/3}$)O$_3$}-(1-Y) (BiAlO$_3$) Ceramics

Barium nitrate as a Ba material, copper nitrate as a Cu material and niobium oxide (Nb$_2$O$_5$) as a niobium material were prepared in a molar ratio of 3:1.2:1, and these materials were then suspended and dissolved in an aqueous acidic solution under heating, followed by an alkaline treatment. The resultant precipitate was collected by filtration, and then dried to obtain a material of Ba(Cu$_{1/3}$,Nb$_{2/3}$)O$_3$.

Then, bismuth oxide and aluminum oxide as an Al material were ground, and repeatedly calcined to obtain a material of BiAlO$_3$. These materials were mixed in various molar ratios (Y was in a range of 0.95 to 0.3), ground by a ball mill, and then subjected to a heat treatment at 1100° C. in the air. Afterward, compaction was carried out by a press molding machine, followed by a sintering treatment at 1250° C. for 10 hours to sinter the compacted material. The thus sintered material was polished, and electrodes were attached thereto. Afterward, polarization was carried out at an electric field intensity of 5 kV/cm to obtain a piezoelectric body of the present invention. This piezoelectric body was formed into a cantilever type having a size of 12×3×1 mm$^3$. To displacement amounts and driving voltages, displacements of the cantilever were measured by a laser doppler, and the results were good. A $d_{33}$ voltage constant thereof was in excess of 100.

The piezoelectric materials of the present invention did not include any alkaline metal, and hence the reproduction of composition control was easy. It was also confirmed that durability of the piezoelectric body scarcely deteriorated at a high temperature and a high humidity.

EXAMPLE 3

Y{Ba(Cu$_{1/3}$,Ta$_{2/3}$)O$_3$}-(1-Y){Bi(Zn)$_{1/3}$,Ti$_{2/3}$)O$_3$} Oriented Ceramics Barium nitrate as a Ba material, copper sulfate as a copper material and tantalum oxide (Ta$_2$O$_5$) as a tantalum material were prepared in a molar ratio of 3:1.1:1, and these materials were then suspended and dissolved in an aqueous acidic solution under heating, followed by an alkaline treatment. The resultant precipitate was collected by filtration, and then dried to obtain a material containing Ba, Cu and Ta.

On the other hand, bismuth oxide and zinc oxide were ground, and repeatedly calcined to obtain a material containing Bi and Zn. This material and the above Ba(Cu$_{1/3}$,Ta$_{2/3}$)O$_3$ material were dispersed in water, and BaTiO$_3$ (110) oriented plate-like particles having an aspect ratio of 5 for orientation control were added so as to be 2.1 moles to the amount of zinc, and the particles were then dispersed therein. After drying, the resultant material was applied so that a layer thickness might be 80 μm, and the dried layers were laminated. After cutting, calcination was carried out at 1160° C. for 7 hours to obtain a single oriented product in which {110} orientation was 82%. Furthermore, it was confirmed by Raman scattering spectroscopy that a crystal phase of this piezoelectric body was a mixed phase system in which tetragonal structure was present in large quantities, but pseudo-cubic structure was also present.

After crystallization, the oxide was polished, and electrodes were attached thereto. Then, polarization was carried out to evaluate properties of the oxide. As a piezoelectric constant of the oxide, $d_{33}$ was in excess of 300.

This piezoelectric body was formed into a ring shape, and used to manufacture an ultrasonic motor shown in FIG. 6. It was confirmed that the piezoelectric body of the present invention had a sufficient driving force and could be utilized in the ultrasonic motor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-250601, filed Sep. 15, 2006, which is hereby incorporated by reference herein in its entirety.

What is claimed is:

1. A piezoelectric element having, a piezoelectric body and a pair of electrodes which are in contact with the piezoelectric body, wherein the piezoelectric body consists of a perovskite type oxide represented by the following formula (3):

(Bi,Ba)(M',M",Cu)O$_3$  (3)

in which M' is an atom of one element selected from the group consisting of Nb, Ta and W, and M" is one or more atoms of elements selected from the group consisting of Mn, Sc, In, Ga, Yb, Al, Mg, Zn, Zr, Fe and Sn, and wherein the piezoelectric body is a piezoelectric body in which crystal phases of at least two of tetragonal structure, rhombohedral structure, pseudo-cubic structure, rhombic system and monoclinic structure are mixedly present.

2. The piezoelectric element according to claim 1, wherein the piezoelectric body has a structure in which a mixing ratio of the crystal phases gradually changes in a thickness direction thereof.

3. A liquid jet head which has the piezoelectric element according to claim 1.

4. An ultrasonic motor which has the piezoelectric element according to claim 1.

* * * * *